(12) United States Patent
Durham et al.

(10) Patent No.: US 9,288,892 B2
(45) Date of Patent: Mar. 15, 2016

(54) TRANSVERSELY ACTUATED PIEZOELECTRIC BELLOWS HEATSINK

(71) Applicant: Lenovo Enterprise Solutions (Singapore) Pte. Ltd., Singapore (SG)

(72) Inventors: Zachary B. Durham, Durham, NC (US); William M. Megarity, Raleigh, NC (US); Matthew L. Nickerson, Raleigh, NC (US); Brian C. Totten, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 142 days.

(21) Appl. No.: 14/293,659

(22) Filed: Jun. 2, 2014

(65) Prior Publication Data

US 2015/0351215 A1    Dec. 3, 2015

(51) Int. Cl.

| | |
|---|---|
| *G06F 1/20* | (2006.01) |
| *H05K 7/20* | (2006.01) |
| *H05K 1/02* | (2006.01) |
| *H01L 41/09* | (2006.01) |
| *F04B 45/047* | (2006.01) |

(52) U.S. Cl.
CPC ............ *H05K 1/0203* (2013.01); *F04B 45/047* (2013.01); *H01L 41/0906* (2013.01); *H05K 7/20136* (2013.01)

(58) Field of Classification Search
CPC ............ H05K 1/0203; H05K 7/20136; H01L 41/0906; H01L 23/467
USPC ............ 361/694, 695, 696, 697, 690, 679.47, 361/679.48; 257/721; 174/16.1
See application file for complete search history.

(56) References Cited

U.S. PATENT DOCUMENTS

| | | | |
|---|---|---|---|
| 4,519,751 A * | 5/1985 | Beckman | .............. F04B 43/095 417/322 |
| 4,803,393 A | 2/1989 | Takahashi | |
| 5,525,041 A | 6/1996 | Deak | |

(Continued)

FOREIGN PATENT DOCUMENTS

EP        2508758 A1     10/2012

OTHER PUBLICATIONS

Advanced Thermal Solutions, Inc., "Piezoelectric Fans and Their Application in Electronics Cooling", Advanced Thermal Solutions, Inc., Qpedia Thermal Emagazine, vol. 5, Issue 4, Apr. 2011, pp. 14-17.

(Continued)

*Primary Examiner* — Anthony Haughton
(74) *Attorney, Agent, or Firm* — Law Office of Jim Boice

(57) ABSTRACT

A transversely actuated piezoelectric bellows heatsink (TAPBH) has a linkage that includes multiple rigid sections coupled by flexible joints. A first fixed support is affixed to a first end of the linkage, and a piezoelectric element is mechanically coupled to a second end of the linkage. A diaphragm is mechanically affixed to a first side of the linkage, and an air enclosure, having an open area, is affixed to the diaphragm. A second fixed support is mechanically affixed to a second side of the linkage. Cyclic power from the power supply causes the piezoelectric element to expand and contract to force the linkage to expand and contract in an analogous manner, thus causing the diaphragm to move in an amplified motion to cause air to enter and be expelled from the air enclosure via air valves.

12 Claims, 2 Drawing Sheets

(56) References Cited

U.S. PATENT DOCUMENTS

| | | | |
|---|---|---|---|
| 5,914,856 A | 6/1999 | Morton et al. | |
| 6,123,145 A * | 9/2000 | Glezer | B64C 21/08 165/104.33 |
| 6,262,519 B1 | 7/2001 | Furlani et al. | |
| 6,471,477 B2 * | 10/2002 | Hassan | B64C 23/04 244/130 |
| 6,588,497 B1 * | 7/2003 | Glezer | F15D 1/009 165/84 |
| 7,107,777 B2 | 9/2006 | Vaiyapuri et al. | |
| 7,633,753 B2 * | 12/2009 | Sauciuc | G06F 1/20 174/16.1 |
| 7,688,583 B1 * | 3/2010 | Arik | F15D 1/00 165/104.28 |
| 7,939,991 B2 | 5/2011 | Yamada et al. | |
| 8,051,905 B2 | 11/2011 | Arik et al. | |
| 8,120,908 B2 | 2/2012 | Arik et al. | |
| 2006/0281398 A1 * | 12/2006 | Yokomizo | G06F 1/203 454/184 |

OTHER PUBLICATIONS

Tim Stevens, "GE Uses Dual Piezo Jets to Keep a Core 17 Laptop Cool, Play a Merry Tune (Hands on Video)", AOL Inc., engadget.com, Dec. 12, 2012, pp. 1-10.

* cited by examiner

TRANSVERSELY ACTUATED PIEZOELECTRIC BELLOWS HEATSINK

BACKGROUND

The present disclosure relates to the field of computing hardware, and specifically to hardware cooling devices. Still more specifically, the present disclosure relates to a bellows heatsink for moving cooling air across one or more components mounted on a circuit board.

Circuit boards are heat intensive. More specifically, electronic components mounted on a circuit board generate high levels of heat. Such electronic components may generate heat while transforming power (i.e., power supplies), executing internal electronic circuitry that includes a massive number of transistors (e.g., processors, memory, etc.), physically moving mechanical components (e.g., hard disk drives), etc. Traditionally, heat is removed by fans, which blow cool air across such electronic components in order to remove heat. However, fans require a large amount of room, due to their size, and produce high levels of noise and vibration, due to their construction and design.

SUMMARY

In one embodiment of the present invention, a transversely actuated piezoelectric bellows heatsink (TAPBH) has a linkage that includes multiple rigid sections coupled by flexible joints. A first fixed support is affixed to a first end of the linkage, and a piezoelectric element is mechanically coupled to a second end of the linkage. A diaphragm is mechanically affixed to a first side of the linkage, and an air enclosure, having an open area, is affixed to the diaphragm. A second fixed support is mechanically affixed to a second side of the linkage. Cyclic power from the power supply causes the piezoelectric element to expand and contract to force the linkage to expand and contract in an analogous manner, thus causing the diaphragm to move in an amplified motion to cause air to enter and be expelled from the air enclosure via air valves.

In one embodiment of the present invention, a circuit board comprises: a power supply; at least one electronic component mounted on the circuit board; a transversely actuated piezoelectric bellows heatsink (TAPBH) mounted on the circuit board, wherein the TAPBH comprises: a linkage, wherein the linkage comprises a plurality of rigid sections coupled by flexible joints; a first fixed support affixed to a first end of the linkage; a piezoelectric element mechanically coupled to a second end of the linkage; a diaphragm mechanically affixed to a first side of the linkage; an air enclosure having an open area affixed to the diaphragm; and a second fixed support mechanically affixed to a second side of the linkage, wherein cyclic power from the power supply causes the piezoelectric element to expand and contract to force the linkage to expand and contract in an analogous manner, thus causing the diaphragm to move in an amplified motion to cause air to enter and be expelled from the air enclosure via air valves, thereby forcing cool air to be blown across said at least one electronic component.

In one embodiment of the present invention, a computer system comprises: a power supply; a circuit board comprising: at least one electronic component mounted on the circuit board; a transversely actuated piezoelectric bellows heatsink (TAPBH) mounted on the circuit board, wherein the TAPBH comprises: a linkage, wherein the linkage comprises a plurality of rigid sections coupled by flexible joints; a first fixed support affixed to a first end of the linkage; a piezoelectric element mechanically coupled to a second end of the linkage; a diaphragm mechanically affixed to a first side of the linkage; an air enclosure having an open area affixed to the diaphragm; and a second fixed support mechanically affixed to a second side of the linkage, wherein cyclic power from the power supply causes the piezoelectric element to expand and contract to force the linkage to expand and contract in an analogous manner, thus causing the diaphragm to move in an amplified motion to cause air to enter and be expelled from the air enclosure via air valves, thereby forcing cool air to be blown across said at least one electronic component.

The above as well as additional objectives, features, and advantages of the present invention will become apparent in the following detailed written description.

BRIEF DESCRIPTION OF THE SEVERAL VIEWS OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
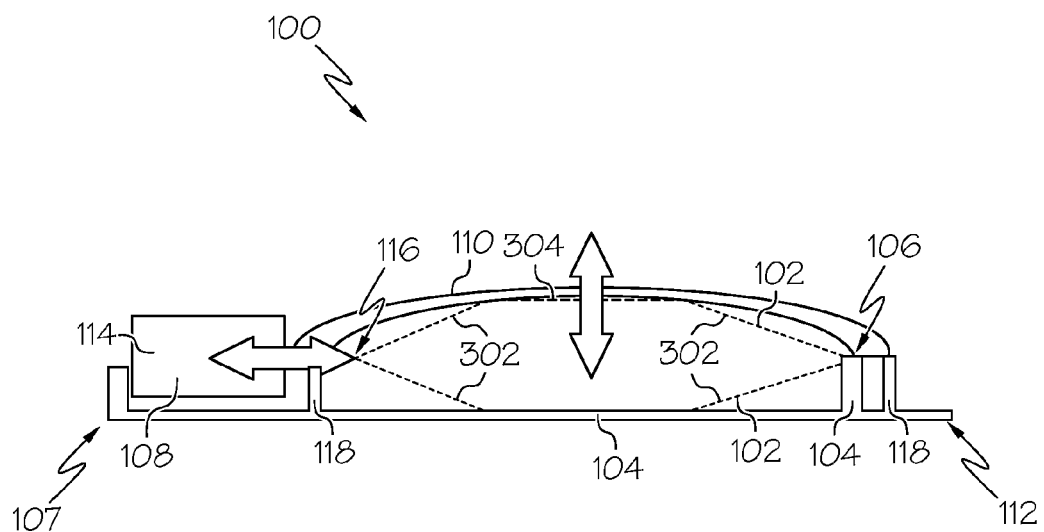
FIG. 1 depicts an exemplary transversely actuated piezoelectric bellows heatsink (TAPBH) in accordance with one or more embodiments of the present invention.

With reference now to FIG. 1, an exemplary transversely actuated piezoelectric bellows heatsink (TAPBH) 100 is depicted. TAPBH 100 comprises a linkage 102. One end of the linkage 102 is connected to a first fixed support 104, such as a stanchion 106 that is mounted to a circuit board 112. An opposing end of the linkage 102 is connected to a piezoelectric element 108. Electrically coupled to the piezoelectric element 108 is a power source 114.

A first side (i.e., the "top" side as shown in FIG. 1) of the linkage 102 is affixed to a diaphragm 110, and an opposing second side (i.e., the "bottom") of the linkage 102 is affixed to a second fixed support 104, such as a surface of the circuit board 112. Circuit board 112 may be any type of electronic board capable of physically and electrically supporting electronic components. While such electronic boards include, but are not limited to solderless board such as breadboards, protoboards, stripboards, etc., in one embodiment circuit board 112 is a printed circuit board (PCB), in which electrically conductive tracks, mounting pads, contacts, and other conductive elements are etched from a metallic (e.g., copper) sheet that is laminated onto a non-conductive substrate (e.g., glass-reinforced epoxy laminate sheets).

Piezoelectric element 108 is composed of piezoelectric material. Piezoelectric material, such as barium titanate (BaTiO$_3$), gallium phosphate (GaPO$_4$), lithium tantalite (LiTaO$_3$), etc., possess unique electrically abilities. First, when mechanically deformed, such piezoelectric materials produce electricity (electrons). Second, when electricity is applied to such piezoelectric materials, they become mechanically deformed. More specifically, such piezoelectric materials change shape in a specific, reversible manner.

Figure 3:
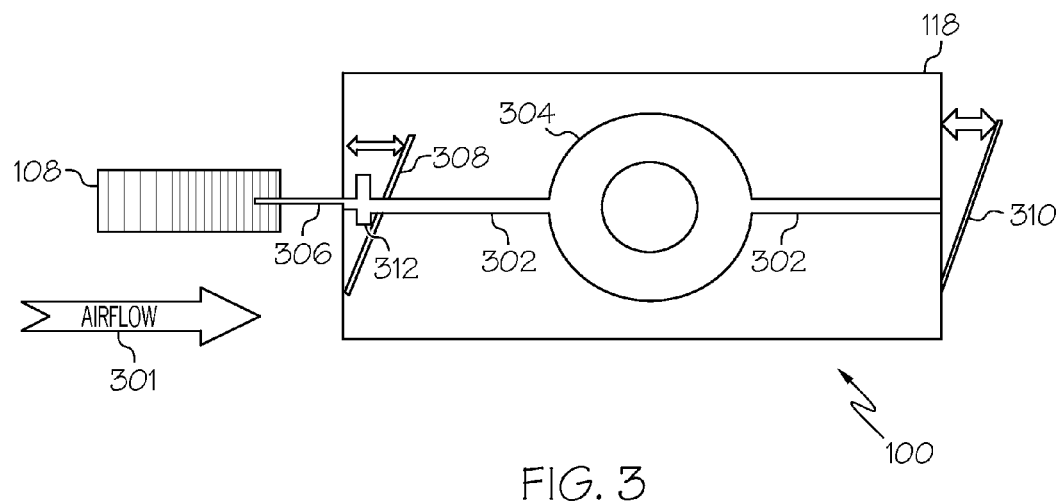
FIG. 3 depicts a top view of the TAPBH shown in FIG. 1, configured for a one direction flow of air.

In one embodiment, the piezoelectric element 108 is actually a series of stacked piezoelectric ceramic discs, as suggested by the representation of piezoelectric element 108 in FIG. 3. Stacking piezoelectric ceramic discs in this manner provides the following benefits. First, each piezoelectric ceramic disc has a limited range of expansion/contraction. That is, the application of electrical voltage to a single piezoelectric ceramic disc causes that disc to have only a limited movement (expansion/contraction). By stacking these piezoelectric ceramic discs, their physical movement is combined, thus providing a greater range of movement to the linkage 102. Second, some piezoelectric ceramic discs will expand/contract in all directions when exposed to electrical voltage. Stacking such discs affords lateral movement from the cumulative effect of the expansion/contraction from one of the multiple directions.

Figure 2:
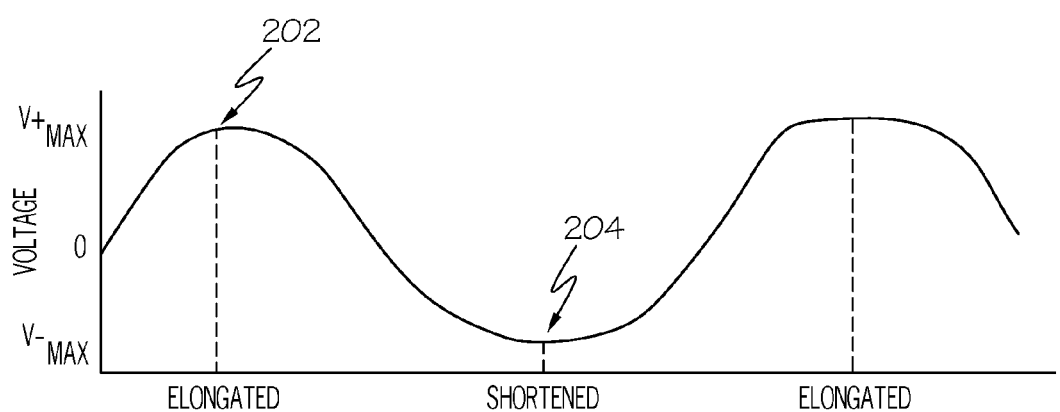
FIG. 2 illustrates a relationship between power supplied to a piezoelectric element in the TAPBH shown in FIG. 1 and resulting movement of the piezoelectric element.

Consider now FIG. 2, which illustrates a relationship between power supplied (e.g., by the power source 114) to a piezoelectric element 108 in the TAPBH 100 shown in FIG. 1, and resulting movement of the piezoelectric element 108. In accordance with one embodiment of the present invention, the power being induced upon the piezoelectric element 108 is cyclic (e.g., sinusoidal, as depicted). Thus, when the voltage is at a maximum positive voltage (see apex 202), the piezoelectric element 108 becomes fully elongated (i.e., enlarges by a maximum expansion that is causes by the maximum positive voltage). When the voltage is at a maximum negative voltage (see nadir 204), the piezoelectric element 108 is fully shortened. Note that the piezoelectric element 108 may or may not be physically capable of expanding/contracting further if voltage levels go beyond the maximum positive/negative voltages.

At transition voltages between the maximum positive voltage ($V+_{max}$) and the maximum negative voltage ($V-_{max}$), the piezoelectric element 108 is lengthened and shortened in an analog manner (i.e., at corresponding levels). Thus, there is a cyclic lengthening and shortening of the piezoelectric element 108 that linearly corresponds to the cyclic voltage being supplied by the power source 114 in FIG. 1.

Returning now to FIG. 1, assume that the voltage being applied to the piezoelectric element 108 is at $V+_{max}$. This results in the piezoelectric element 108 being fully elongated, thus causing the top of the linkage 102 to push the diaphragm 110 upwards to its highest position. When the voltage being applied to the piezoelectric element 108 is at $V-_{max}$, this results in the piezoelectric element 108 being fully shrunk, thus causing the top of the linkage 102 to pull the diaphragm 110 downwards to its lowest position. By supplying a cyclic voltage, such as depicted in FIG. 2, to the piezoelectric element 108, a resulting up-and-down motion is imparted to/imposed on the diaphragm 110.

Assume now that the diaphragm 110 shown in FIG. 1 is mated to an air enclosure (e.g., enclosure 118), such as an open-topped cylinder of rigid plastic, rubber, etc. Together, the diaphragm 110 and enclosure 118 create an air-sealed enclosure in which the diaphragm 110 is able to pull air in and exhaust air out of the enclosure 118 via vents/valves (see FIG. 3).

Thus, in one or more embodiments, the TAPBH 100 operates in the following exemplary manner.

As voltage supplied by the power source 114 increases towards a positive voltage, the piezoelectric element 108 (which is affixed to and/or pushes against a fixed support 107 at one end) lengthens. This lengthening of the piezoelectric element 108 pushes against the first end of the linkage 102 (i.e., the "left" end of linkage 102, also shown as slat linkages 302), causing the linkage 102 to articulate upward. That is, the "left" end of the linkage 102 acts as a hinge, which causes the top of the linkage 102 to travel upwards. This upward articulation pushes against the diaphragm 110, thereby causing air to be pulled into the enclosure 118.

As voltage supplied by the power source 114 moves towards a negative voltage, the piezoelectric element 108 shortens. This shortening of the piezoelectric element 108 pulls the first end (e.g., the "left" end in FIG. 1) of the linkage 102, causing the linkage 102 to articulate downward. This downward articulation pulls the diaphragm 110 downward, causing air to be pushed out of the enclosure 118.

By cycling the voltage being applied to the piezoelectric element 108 (see FIG. 2), the TAPBH 100 acts as a bellows pump, pushing and pulling air in and out of the enclosure 118. Note the following useful features of TAPBH 100.

First, linkage 102 amplifies mechanical movement from the piezoelectric element 108. That is, when configured as depicted in FIG. 1, a small amount of horizontal movement of the piezoelectric element 108 translates into a large amount of vertical movement of the diaphragm 110. Thus, the relatively small movement that is inherent in piezoelectric materials is maximized.

Second, all expansion/contraction of the piezoelectric element 108 is parallel to the circuit board 112. This minimizes the amount of vibration that is induced against the circuit board 112. That is, even though the linkage 102 and diaphragm 110 exert vibration forces normal (perpendicular) to the circuit board 112, mechanical movement from the piezoelectric element 108 is parallel to the circuit board 112, thus minimizing damaging vibration that is impressed upon the circuit board 112 by the piezoelectric element 108.

In order to capture cool air from one area above the circuit board 112 and move it to a hot spot on the circuit board 112 (e.g., where a component on the circuit board 112, not shown in the figures, needs cooling air), various valves are installed on the enclosure 118. For example, consider now FIG. 3, which depicts a top view of the TAPBH 100 shown in FIG. 1, configured for a one direction flow of air. As shown in further detail in FIG. 3, the linkage 102 shown in FIG. 1 includes two components: slat linkages 302 and a pressure distributor 304.

As depicted in FIG. 1 and FIG. 3, in one embodiment the slat linkages 302 are semi-rigid slats. These semi-rigid slats are rigid except where they bend, thus are "semi-rigid". That is, any straight line depicted in the linkage 102 in FIG. 1 depicts a rigid slat, while any connecting angle (e.g., joint 116) depicts a flexible joint, even though the rigid slats and the flexible joints can be parts of a same piece of material. However, when this material is bent, it will weaken, thus creating a natural hinge point.

As depicted in FIG. 1 and FIG. 3, the pressure distributor 304 is a broadened area of the linkage 102, including the slat linkages 302 shown in FIG. 3. As depicted in FIG. 3, the pressure distributor 304 is a disc, toroid, or other circular shape, thus providing uniform pressure against the diaphragm 110, in order to minimize tearing, undue distortion, etc. of the diaphragm 110 as the linkage 102 expands upwards.

Note that the piezoelectric element 108 is mechanically coupled to the slat linkages 302 (linkage 102) by a stinger 306, which may be any rigid material that is resistant to both compression and stretching, such that all lateral movement of the piezoelectric element 108 is efficiently transferred to the slat linkages 302.

The embodiment of TAPBH 100 shown in FIG. 3 thus moves air in a single direction (airflow 301) through the use of two air valves: intake valve 308 and outflow valve 310. As the piezoelectric element 108 expands, the stinger 306 pushes against both the slat linkages 302 as well as the intake valve 308. As depicted and in one embodiment, intake valve 308 is a flap valve that internally seats against an intake orifice (not shown) in the enclosure 118. The stinger 306 is adjusted such that the intake valve 308 seats against the intake orifice before the slat linkages 302 are fully pulled down, thus causing air to be positively expelled through the outflow valve 310. Note that outflow valve 310 is also a flap valve that seats against an outflow orifice (not shown) unless there is positive pressure within the enclosure 118.

In one embodiment, stinger 306 is able to slideably move through an opening (not shown) in the enclosure 118, which preferably has a flexible seal that keeps air from passing through this opening. In this embodiment, the movement of the air into and out of the enclosure 118 causes the intake valve 308 and outflow valve 310 to open and close. That is, as air is being pulled into the enclosure 118 due to the movement of the slat linkages 302 and the diaphragm (e.g., diaphragm 110 shown in FIG. 1), the intake valve 308 (e.g., a flapper valve) will open. As air is being pushed out of the enclosure 118 by the reverse movement of the slat linkages 302 and the diaphragm, the intake valve 308 will close and the outflow valve 310 will be pushed open.

In one embodiment, additional mechanical assistance is provided to open/close valves in the enclosure 118. For example, as shown in an alternative embodiment in FIG. 3, stinger 306 is able to slideably move through an opening (not shown) in the intake valve 308. A lip 312 (i.e., a flange) surrounding (i.e., axially circumscribing) and affixed to the stinger 306 pushes the intake valve 308 open when the piezoelectric element 108 elongates. When the piezoelectric element 108 shortens, pressure against the intake valve 308 from the lip 312 decreases to zero.

Note that in either embodiment just described for FIG. 3 (i.e., with or without the lip 312), the stinger 306 continues to pull against the slat linkages 302 after the intake valve 308 closes, such that the diaphragm is further pulled down by the connected pressure distributor 304. Thus additional pulling down of the diaphragm causes air to be forced out the outflow valve 310, which opens outwards.

Figure 4:
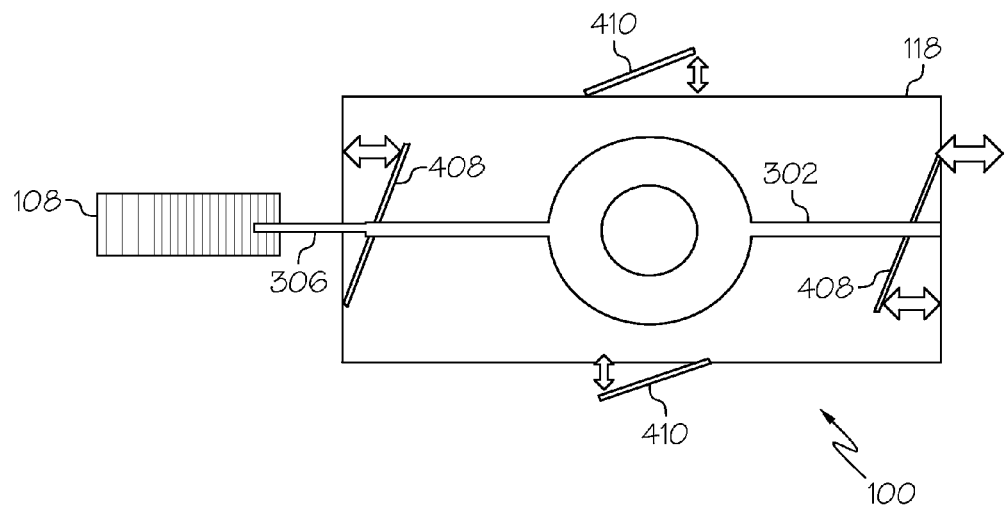
FIG. 4 depicts a top view of the TAPBH shown in FIG. 1, configured for a multi-direction flow of air.

In another embodiment, TAPBH 100 is configured to direct cooling air in multiple directions. For example, consider now the embodiment of TAPBH 100 depicted in FIG. 4, which shows a top view of the TAPBH 100 shown in FIG. 1 configured for a multi-direction flow of air. As depicted in FIG. 4, TAPBH 100 has two intake valves 408 and two outflow valves 410. As the piezoelectric element 108 elongates, the stinger 306 pushes against the slat linkages 302 and the diaphragm, causing the intake valves 408 to open due to air being pulled into the enclosure 118. As with the embodiment shown in FIG. 3, the stinger 306 length is adjusted such that air is expelled through outflow valves 410 (depicted as flap valves that cover openings in the enclosure 118—not shown) as the slat linkages 302 are further collapsed, causing the diaphragm to force air out of the enclosure 118.

While the outflow valves 410 are shown as two in number, note that in various embodiments multiple outflow valves 410 can be part of the enclosure 118, depending on the location of particular components near the TAPBH 100 that need cooling air.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A transversely actuated piezoelectric bellows heatsink (TAPBH) comprising:
    a linkage, wherein the linkage comprises a plurality of rigid sections coupled by flexible joints;
    a first end of the linkage affixed to a first fixed support;
    a piezoelectric element mechanically coupled to a second end of the linkage;
    a diaphragm mechanically affixed to a first side of the linkage;
    an air enclosure having an open area affixed to the diaphragm; and
    a second side of the linkage, wherein a second fixed support is mechanically affixed to the second side of the linkage, wherein cyclic power from a power supply causes the piezoelectric element to expand and contract to force the linkage to expand and contract in an analogous manner, thus causing the diaphragm to move in an amplified motion to cause air to enter and be expelled from the air enclosure via air valves.

2. The TAPBH of claim 1, wherein the air valves are flapper valves.

3. The TAPBH of claim 1, further comprising:
    an intake valve, wherein the intake valve is a flapper valve that occludes an orifice in the air enclosure;
    a stinger that mechanically couples the piezoelectric element to the linkage, wherein the stinger slideably passes through the intake valve; and
    a lip axially circumscribing the stinger, wherein the lip pushes the intake valve open in response to the piezoelectric element expanding.

4. The TAPBH of claim 1, further comprising:
    a pressure distributor affixed to the first side of the linkage, wherein the pressure distributor is a broadened area of the linkage, and wherein the pressure distributor distributes pressure from the linkage against the diaphragm.

5. A circuit board comprising:
    a power supply;
    at least one electronic component mounted on the circuit board;
    a transversely actuated piezoelectric bellows heatsink (TAPBH) mounted on the circuit board, wherein the TAPBH comprises:

a linkage, wherein the linkage comprises a plurality of rigid sections coupled by flexible joints;
a first end of the linkage affixed to a first fixed support;
a piezoelectric element mechanically coupled to a second end of the linkage;
a diaphragm mechanically affixed to a first side of the linkage; and
an air enclosure having an open area affixed to the diaphragm; and
a second fixed support affixed to a second side of the linkage, wherein cyclic power from the power supply causes the piezoelectric element to expand and contract to force the linkage to expand and contract in an analogous manner, thus causing the diaphragm to move in an amplified motion to cause air to enter and be expelled from the air enclosure via air valves, thereby forcing cool air to be blown across said at least one electronic component.

6. The circuit board of claim 5, wherein the air valves are flapper valves.

7. The circuit board of claim 5, wherein the TAPBH further comprises:
an intake valve, wherein the intake valve is a flapper valve that occludes an orifice in the air enclosure;
a stinger that mechanically couples the piezoelectric element to the linkage, wherein the stinger slideably passes through the intake valve; and
a lip axially circumscribing the stinger, wherein the lip pushes the intake valve open in response to the piezoelectric element expanding.

8. The circuit board of claim 5, wherein the TAPBH further comprises:
a pressure distributor affixed to the first side of the linkage, wherein the pressure distributor is a broadened area of the linkage, and wherein the pressure distributor distributes pressure from the linkage against the diaphragm.

9. A computer system comprising:
a power supply;
a circuit board comprising:
at least one electronic component mounted on the circuit board;
a transversely actuated piezoelectric bellows heatsink (TAPBH) mounted on the circuit board, wherein the TAPBH comprises:
a linkage, wherein the linkage comprises a plurality of rigid sections coupled by flexible joints;
a first end of the linkage affixed to a first fixed support;
a piezoelectric element mechanically coupled to a second end of the linkage;
a diaphragm mechanically affixed to a first side of the linkage; and
an air enclosure having an open area affixed to the diaphragm; and
a second fixed support mechanically affixed to a second side of the linkage, wherein cyclic power from the power supply causes the piezoelectric element to expand and contract to force the linkage to expand and contract in an analogous manner, thus causing the diaphragm to move in an amplified motion to cause air to enter and be expelled from the air enclosure via air valves, thereby forcing cool air to be blown across said at least one electronic component.

10. The computer system of claim 9, wherein the air valves are flapper valves.

11. The computer system of claim 9, wherein the TAPBH further comprises:
an intake valve, wherein the intake valve is a flapper valve that occludes an orifice in the air enclosure;
a stinger that mechanically couples the piezoelectric element to the linkage, wherein the stinger slideably passes through the intake valve; and
a lip axially circumscribing the stinger, wherein the lip pushes the intake valve open in response to the piezoelectric element expanding.

12. The computer system of claim 9, wherein the TAPBH further comprises:
a pressure distributor affixed to the first side of the linkage, wherein the pressure distributor is a broadened area of the linkage, and wherein the pressure distributor distributes pressure from the linkage against the diaphragm.

\* \* \* \* \*